(12) United States Patent
Barroux et al.

(10) Patent No.: US 9,940,413 B2
(45) Date of Patent: Apr. 10, 2018

(54) METHOD OF EXPLOITING A HYDROCARBON DEPOSIT CONTAINING ORGANOSULFUR COMPOUNDS BY MEANS OF A THERMOKINETIC MODEL AND A COMPOSITIONAL RESERVOIR SIMULATION

(71) Applicant: IFP Energies nouvelles, Rueil-Malmaison (FR)

(72) Inventors: Claire Barroux, Chaville (FR); Violaine Lamoureux-Var, Chatou (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 1005 days.

(21) Appl. No.: 14/200,682

(22) Filed: Mar. 7, 2014

(65) Prior Publication Data

US 2014/0257774 A1    Sep. 11, 2014

(30) Foreign Application Priority Data

Mar. 8, 2013 (FR) ...................................... 13 52091

(51) Int. Cl.
| | |
|---|---|
| G06F 7/60 | (2006.01) |
| G06G 7/48 | (2006.01) |
| G06F 17/50 | (2006.01) |
| E21B 43/16 | (2006.01) |

(52) U.S. Cl.
CPC .......... *G06F 17/5009* (2013.01); *E21B 43/16* (2013.01)

(58) Field of Classification Search
CPC .............................. G06F 17/5009; E21B 43/16
USPC ...................................................... 703/2, 10
See application file for complete search history.

(56) References Cited

U.S. PATENT DOCUMENTS

| | | | | |
|---|---|---|---|---|
| 6,969,123 | B2 * | 11/2005 | Vinegar ................ | E21B 43/006 166/302 |
| 2007/0100594 | A1 * | 5/2007 | Lamoureux-Var ..... | G01N 33/24 703/10 |
| 2011/0308790 | A1 * | 12/2011 | Strapoc .................. | C09K 8/582 166/250.01 |

OTHER PUBLICATIONS

Maria, "A review of algorithms and trends in kinetic model identification for chemical and biochemical systems", 2004, Chemical and Biochemical Engineering Quarterly 18.3, pp. 195-222.*

Lamoureux-Var & Lorant, "H2S artificial formation as a result of steam injection for EOR: a compositional kinetic approach", Nov. 2005, SPE/PS-CIM/CHOA International Thermal Operations and Heavy Oil Symposium, pp. 1-4.*

(Continued)

*Primary Examiner* — Juan Ochoa

(74) *Attorney, Agent, or Firm* — Fitch, Even, Tabin & Flannery LLP

(57) ABSTRACT

The invention is a method for determining an amount of hydrogen sulfide produced by aquathermolysis induced by a thermal process, such as steam injection. The hydrocarbons are described with a compositional representation using $H_2S$ and the fractions saturated compounds, aromatics, resins and asphaltenes. A kinetic model is constructed based on the compositional representation using an elementary model obtained by mass balance for sulfur distributed within the fractions. A thermodynamic model is constructed based on the same compositional representation. The amount of produced $H_2S$ is determined by performing a compositional reservoir simulation using a compositional and reactive thermal simulator using the kinetic and thermodynamic models.

28 Claims, 8 Drawing Sheets

(56) References Cited

OTHER PUBLICATIONS

Hyne J.B. et al., 1984, "Aquathermolysis of heavy oils", 2nd Int. Conf., The Future of Heavy Crude and Tar Sands, McGraw Hill, New York, Chapter 45, p. 404-411.
Peng, D. Y., and Robinson, D. B., 1976, A New Two-Constant Equation of State. Industrial and Engineering Chemistry Fundamentals, vol. 15, No. 1, pp. 59-64.
Søreide, I. and Whitson, C. H. 1992. Peng-Robinson Predictions for Hydrocarbons $CO_2$, $N_2$, and $H_2S$ with Pure Water and NaCl Brine. Fluid Phase Equilibria, 77, pp. 217-240.
Coats, K. H., 1980, In-Situ Combustion Model. SPE Journal, SPE 8394, December, 533-554.
Boduszynski, M.M. 1987, Composition of Heavy Petroleums. 1. Molecular Weight, Hydrogen Deficiency, and Heteroatom Concentration as a Function of Atmospheric Equivalent Boiling Point up to 1400° F. (760° C.). Energy & Fuels, vol. 1, pp. 2-11.
Merdrignac, I. and Espinat D. 2007. Physicochemical Characterization of Petroleum Fractions: the State of the Art. Oil & Gas Science and Technology—vol. 62, No. 1, pp. 7-32.
Crookston, R. B., Culham, W. E., Chen, W. H., Feb. 1979, A Numerical Simulation Model Recovery Processes for Thermal Recovery Processes. SPE 6724, SPE J., pp. 37-58.
Lamoureux-Var, V., Kowalewski, I., Kohler, E. 2010. Forecasting $H_2S$ Generated from Steamed Oil Sands Insights into $H_2S$ Generation through Experimental Investigation, AAPG Hedberg Conference, Jun. 8-11, 2010—Vail, Colorado.
Souahi, F. and Kaabeche, H., 2008, Developing Correlations for Prediction of Petroleum Fraction Properties using Genetic Algorithms, OGST, vol. 63, No. 2, March-April, pp. 229-237.
Stamataki, S. and Magoulas, K. 2000, Prediction of Phase Equilibria and Volumetric Behavior of Fluids with High Concentration of Hydrogen Sulfide. Oil & Gas Science and Technology—vol. 55,No. 5, 511-522.
Loria, H, Pereira-Almao, P. et Satyro, M., 2009, Prediction of Density and Viscosity of Bitumen Using the Peng-Robinson Equation of State. Ind. Eng. Chem. Res. , 48, pp. 10129-10135.
Dadgostar, N., Shaw, J.M., 2012, A Predictive Correlation for the Constant-Pressure Specific Heat Capacity of Pure and Ill-Defined Liquid Hydrocarbons, Fluid Phase Equilibria, 313, pp. 211-226.
Willsch, H., Clegg, H., Horsfield, B., Radke, M., and Wilkes H.,1997, Liquid Chromatographic Separation of Sediment, Rock, and Coal Extracts and Crude Oil into Compound Classe, Analytical Chemistry, vol. 69, No. 20, 4203-4209.

\* cited by examiner

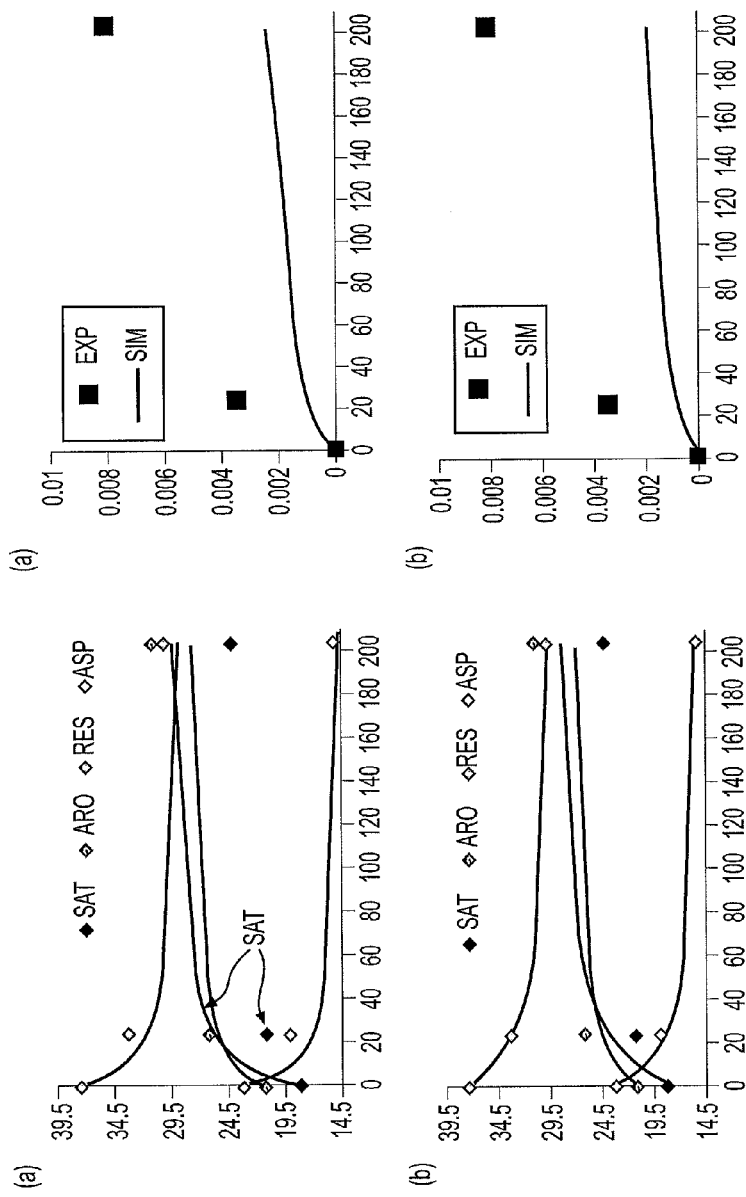
FIG. 2.1

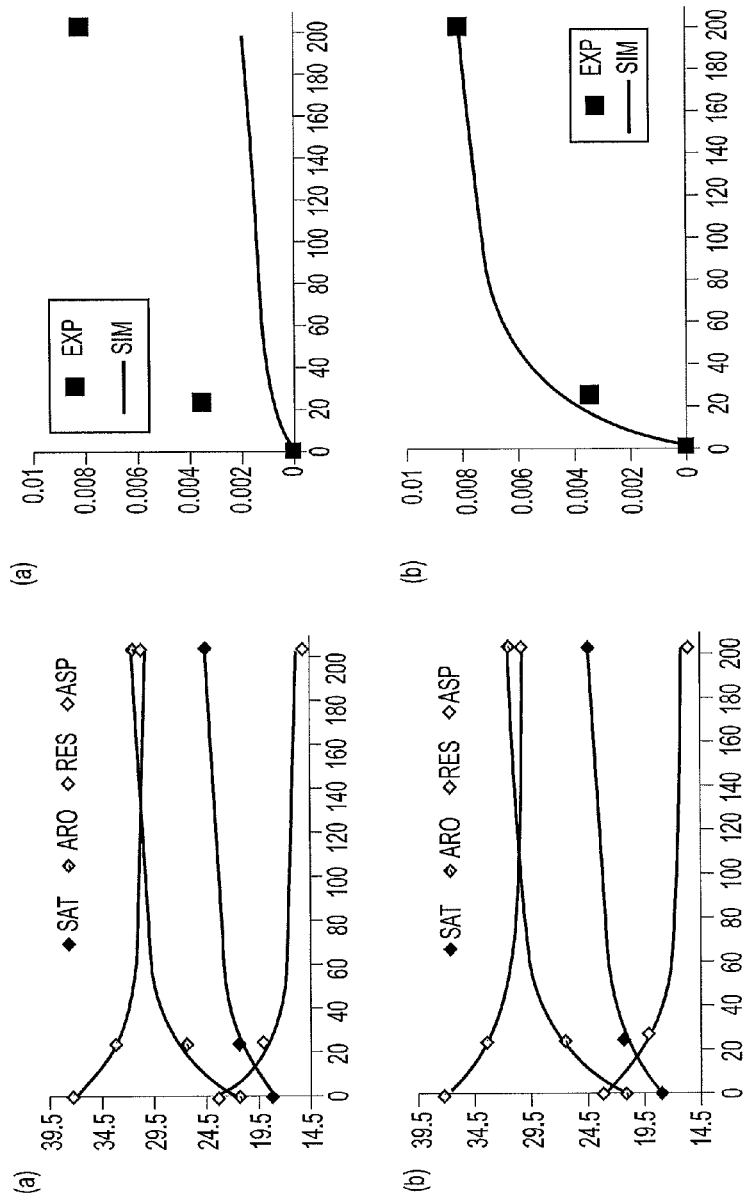
FIG. 2.2

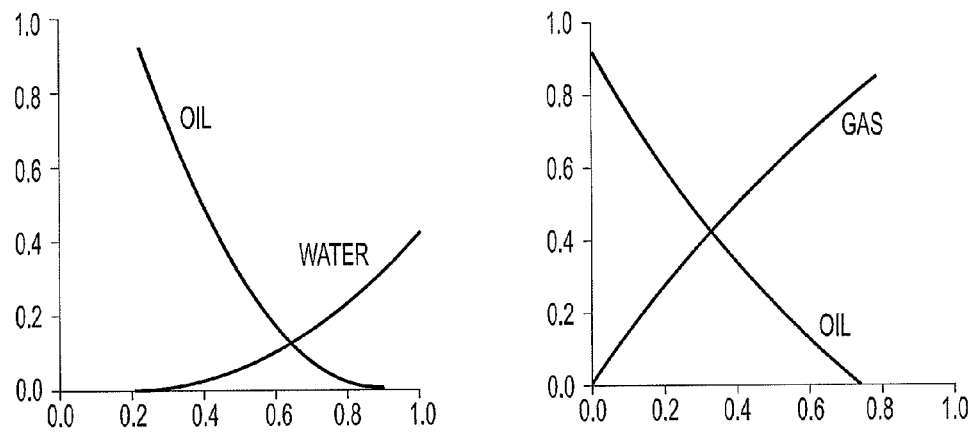
FIG. 3
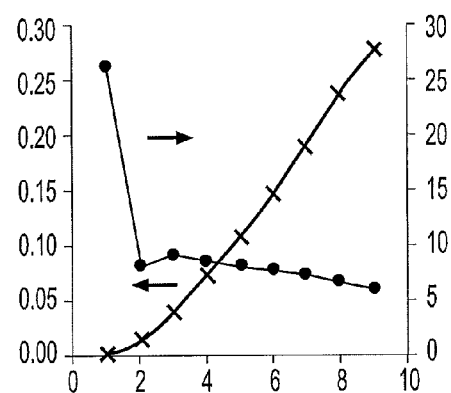
FIG. 4.1

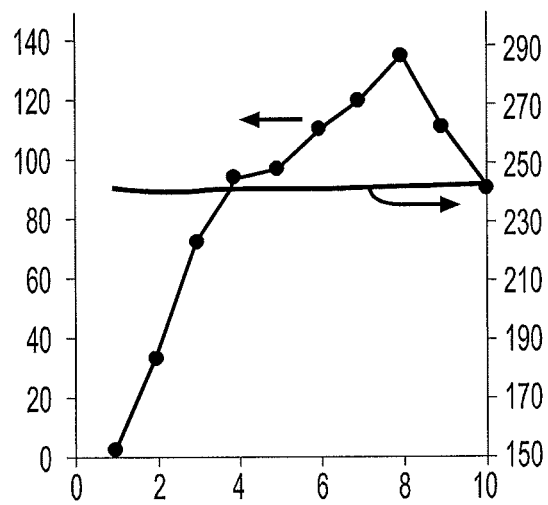
FIG. 4.2
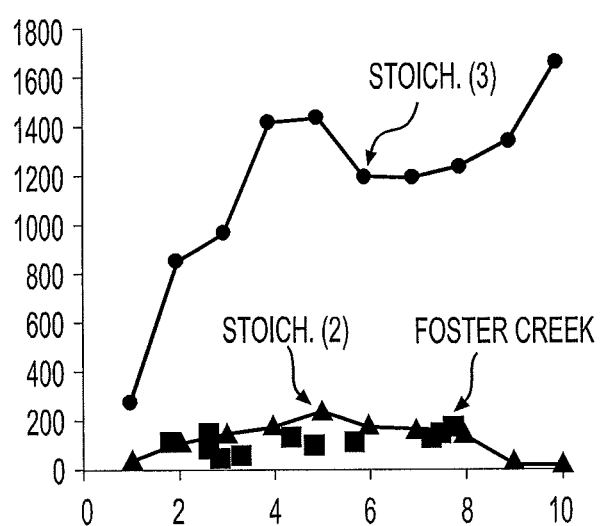
FIG. 5

METHOD OF EXPLOITING A HYDROCARBON DEPOSIT CONTAINING ORGANOSULFUR COMPOUNDS BY MEANS OF A THERMOKINETIC MODEL AND A COMPOSITIONAL RESERVOIR SIMULATION

BACKGROUND OF THE INVENTION

Field of the Invention

The invention relates to the field of oil exploration, and more particularly the field of the exploitation of a deposit of hydrocarbons containing organosulfur compounds, by a thermal process such as a steam injection process.

Description of the Prior Art

During the exploitation of reservoirs of heavy crudes by a steam injection process, a phenomenon of aquathermolysis occurs, which generates hydrogen sulfide ($H_2S$). In fact this type of reservoir often contains high sulfur contents. Thermal processes make it possible, by supplying calories and raising the temperature, to reduce the viscosity of the heavy crudes and thus make them producible.

Aquathermolysis is defined as a set of physicochemical reactions between rock impregnated with crude oil (or with bitumen) and steam, at temperatures between 200° C. and 300° C. A definition is given in the following document: Hyne J. B. et al., 1984, *"Aquathermolysis of heavy oils"*, 2nd Int. Conf., The Future of Heavy Crude and Tar Sands, McGraw Hill, New York, Chapter 45, p. 404-411.

Hydrogen sulfide is a gas that is both extremely corrosive and highly toxic, or even lethal above a certain concentration. Thus, predicting the concentration of $H_2S$ in the gas produced during recovery assisted by steam injection helps, on the one hand, to reduce the costs of production by adapting the completion materials and the gas treatment devices, by optimizing the operating conditions, and on the other hand to avoid emissions that are dangerous to people and the environment.

One technical problem is prediction of the amount of $H_2S$ generated depending on the nature of the crude, the reservoir conditions and the steam injection conditions. If prediction of the risk of production of $H_2S$ based on a reservoir model (used by flow simulators) is desired, a kinetic model of hydrogen sulfide generation is indispensable.

A method is known from patent application FR2892817 for constructing a kinetic model for estimating the mass of hydrogen sulfide produced by aquathermolysis of rock containing crude oil, by describing the evolution of the distribution of sulfur in the oil fractions and the insolubles fraction. This document provides an exhaustive review of the state of the art prior to this publication. The method supplies an elementary reaction scheme, for the element sulfur, that is predictive, obtained from the mass balance for the element sulfur distributed within fractions such as resins or asphaltene fractions, but is not usable for reservoir simulations that use information on constituents of the molecular type, rather than information on atomic elements.

Other thermokinetic models are also known for estimating the mass of hydrogen sulfide produced by aquathermolysis of rock containing crude oil. However these models have at least one of the following problems:

their complexity means they cannot be used in reservoir simulators for carrying out reservoir simulations;

there is no assurance of consistency between the thermodynamic parameters of the constituents and the reaction scheme (in particular the stoichiometry of the reactions);

the stoichiometric coefficients of the reactions are expressed in mass fractions rather than in mole fractions;

insufficiently precise models (resins are not taken into account in the production of hydrogen sulfide, no description of the evolution of the distribution of sulfur in the various fractions is provided, etc.);

models are without thermodynamic characterization of the pseudo-constituents;

models are not predictive (it is necessary to produce first, before the models can be established).

SUMMARY OF THE INVENTION

The invention relates to a method of exploiting a hydrocarbon deposit containing organosulfur compounds by use of a thermokinetic model and a compositional reservoir simulation. The thermokinetic model constructed in the method according to the invention overcomes the problems of the earlier models.

In general, the invention relates to a method for determining an amount of hydrogen sulfide produced by a phenomenon of aquathermolysis induced by a thermal process, such as steam injection, applied to an underground deposit of hydrocarbons containing organosulfur compounds. The method comprises the following steps:

the hydrocarbons are described by use of a compositional representation using $H_2S$ and four fractions: saturated compounds, aromatics, resins and asphaltenes;

a kinetic model is constructed on the basis of the compositional representation, starting from an elementary model obtained by mass balance for the element sulfur distributed within the fractions;

a thermodynamic model is constructed on the basis of the compositional representation;

the amount of hydrogen sulfide ($H_2S$) produced is determined by performing a compositional reservoir simulation by use of a compositional and reactive thermal simulator which employes the kinetic model and the thermodynamic model which is step 30 of FIG. 8.

According to the invention, the kinetic model can be constructed by considering the reactants of the reactions of $H_2S$ generation to belong to the classes of resins and asphaltenes, and by considering that the products of the reactions belong to the total of $H_2S$, saturated fractions, aromatic fractions and a pseudo-constituent of the solid type such as coke.

According to the invention, the kinetic model can comprise Nt constituents and Nr reactions, and a Nr×Nt matrix of stoichiometric coefficients of the various reactions is constructed; the stoichiometric coefficients are determined from an elementary reaction scheme obtained by mass balance for the element sulfur.

The kinetic model can be adjusted by simulating aquathermolysis experiments or by simulating the behavior of a field subjected to a thermal process, a field for which production measurements allowing calculation of $H_2S$ production are available. The kinetic model can be adjusted by adjusting time constants for restoring a decrease in resins and asphaltenes as a function of time, or by adjusting the relative stoichiometry between the saturated fractions and the aromatics, or by adjusting the relative stoichiometry between H$_2$S and a pseudo-constituent of the solid type such as coke.

According to one embodiment, the compositional representation comprises:

pseudo-constituents for representing fluid phases and phases that can be made to become fluid, notably by the effect of temperature;

at least one pseudo-constituent of the solid type (COK), such as coke;

at least one constituent representing water.

According to the invention, the fraction of saturated compounds can represent the only fraction of compounds not containing sulfur.

The invention also relates to a method of exploiting an underground deposit of hydrocarbons containing organosulfur compounds, in which:

i. an amount of hydrogen sulfide (H$_2$S) produced by a phenomenon of aquathermolysis induced by a thermal process such as injection of steam into the deposit is determined by the method according to the invention;

ii. the exploitation conditions of the deposit are determined as a function of the amount of hydrogen sulfide;

iii. the hydrocarbons are produced by applying the exploitation conditions.

The amount of hydrogen sulfide can be compared with an amount measured in the past, and parameters of the kinetic model and/or of the thermal model are adjusted.

Production of H$_2$S by the deposit can be predicted from the adjusted models.

The exploitation conditions can be determined, adapting completion materials and/or gas treatment devices.

The exploitation conditions can be modified by adapting the conditions of steam injection.

Finally, according to the invention the amount of hydrogen sulfide can be compared with a maximum legal content, and the exploitation conditions are determined to maintain production of hydrogen sulfide below the maximum legal content.

BRIEF DESCRIPTION OF THE DRAWINGS

FIG. 2.1 illustrates results of simulations of the reactor type (lines) relative to the experimental results (points). FIG. 2.1 on the left has parts (a) and (b) and on the right parts (a) and (b). On the left in parts (a) and (b) are illustrated mass fractions of component of the oil produced as a function of time (hours) and on the right in parts (a) and (b) are illustrated the mass of H$_2$S produced relative to the total mass produced of pseudo-constituents SAT, ARO, RES, ASP as a function of time (hours). Results are obtained (a) with stoichiometry (1) and the kinetic parameters (1), (b) with stoichiometry (1) and the kinetic parameters (2);

FIG. 2.2 illustrates results of the simulations of the reactor type (lines) relative to the experimental results (points). FIG. 2.2 on the left has parts (a) and (b) and on the right parts (a) and (b). On the left in parts (a) and (b) are illustrated mass fractions of component of the oil produced as a function of time (hours) and on the right in parts (a) and (b) are illustrated the mass of H$_2$S produced relative to the total mass produced of pseudo-constituents SAT, ARO, RES, ASP as a function of time (hours). Results are obtained (a) with stoichiometry (2) and the kinetic parameters (2), (b) with stoichiometry (3) and the kinetic parameters (3);

FIG. 3 shows curves of relative permeabilities (kr) used in the simulations which on the left is water-oil kr as a function of water saturation (as a fraction of pore volume) and on the right is gas-oil kr as a function of gas saturation (as a fraction of pore volume);

FIG. 4.1 shows cumulative oil production (millions of m$^3$ at the surface which on the left axis is a ratio of cumulative amounts steam injected/oil produced (equivalent m$^3$ water/m$^3$ oil, and on the right axis is as a function of time (years);

FIG. 4.2 shows flow rate of oil produced in surface conditions (m$^3$/day, left axis) and injection well bottom temperature (° C., right axis), as a function of time (years);

FIG. 5 illustrates a ratio of liters of H$_2$S produced per m$^3$ of oil produced as a function of time (years). Results (black points and lines) are simulated with stoichiometries (2) and (3) and field data;

DETAILED DESCRIPTION OF THE METHOD ACCORDING TO THE INVENTION

The words "hydrocarbon" and "hydrocarbons" can be used here, as often in reservoir engineering, in the broad sense which denote both hydrocarbons in the strict sense (saturated, aromatic) and organosulfur compounds.

Hydrocarbon mixtures are represented, in reservoir simulation, as mixtures of "constituents" and/or "pseudo-constituents". The word "constituent" denotes first molecular species such as hydrogen sulfide (H$_2$S), methane, etc. The word "pseudo-constituent" denotes a mixture of molecular species that can be likened to a single molecular species for the problem under discussion.

Hereinafter, the words "compound", "component", "pseudo-compound", "pseudo-component", "pseudo-constituent", "pseudo-constituent", "constituent" denote species that relate to molecular species. The term "constituent" therefore is not necessarily reserved for "pure molecular substances" such as H$_2$S, CH$_4$, etc.

The word element, used outside of a mathematical context, is reserved to denote an elementary atomic species such as sulfur S, carbon C, hydrogen H, etc.

The present invention relates to a method, and the use thereof, for modeling the production of hydrogen sulfide ($H_2S$) induced by reactions taking place in an underground deposit of hydrocarbons when this deposit is submitted to a thermal recovery process, which in particular is a steam injection process. The reactions are then due to the phenomenon of aquathermolysis.

Figure 7:
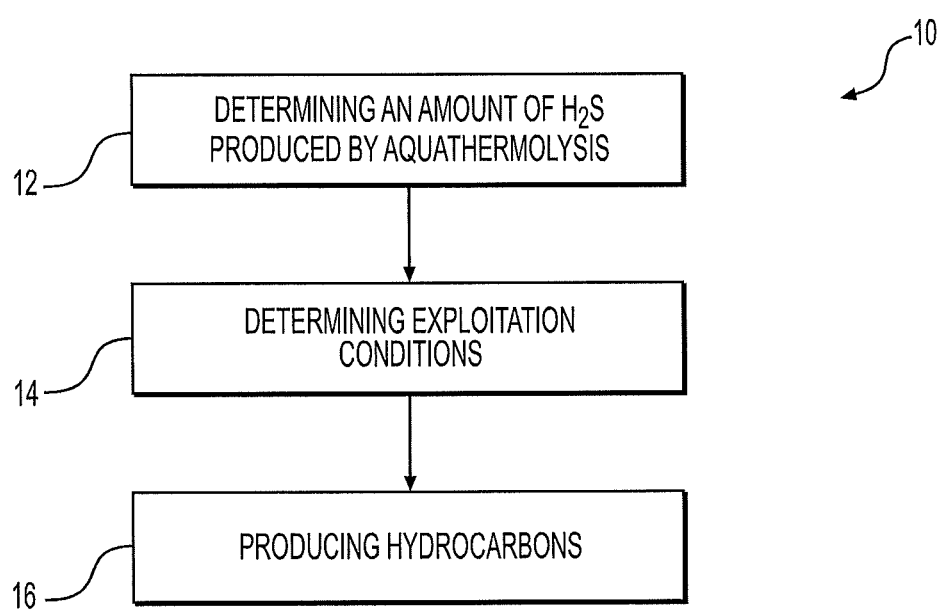
FIG. 7 illustrates a flow chart of the basic process steps of the invention including determining an amount of H$_2$S produced by aquathermolysis, determining exploitation conditions and producing hydrocarbons.
Figure 8:
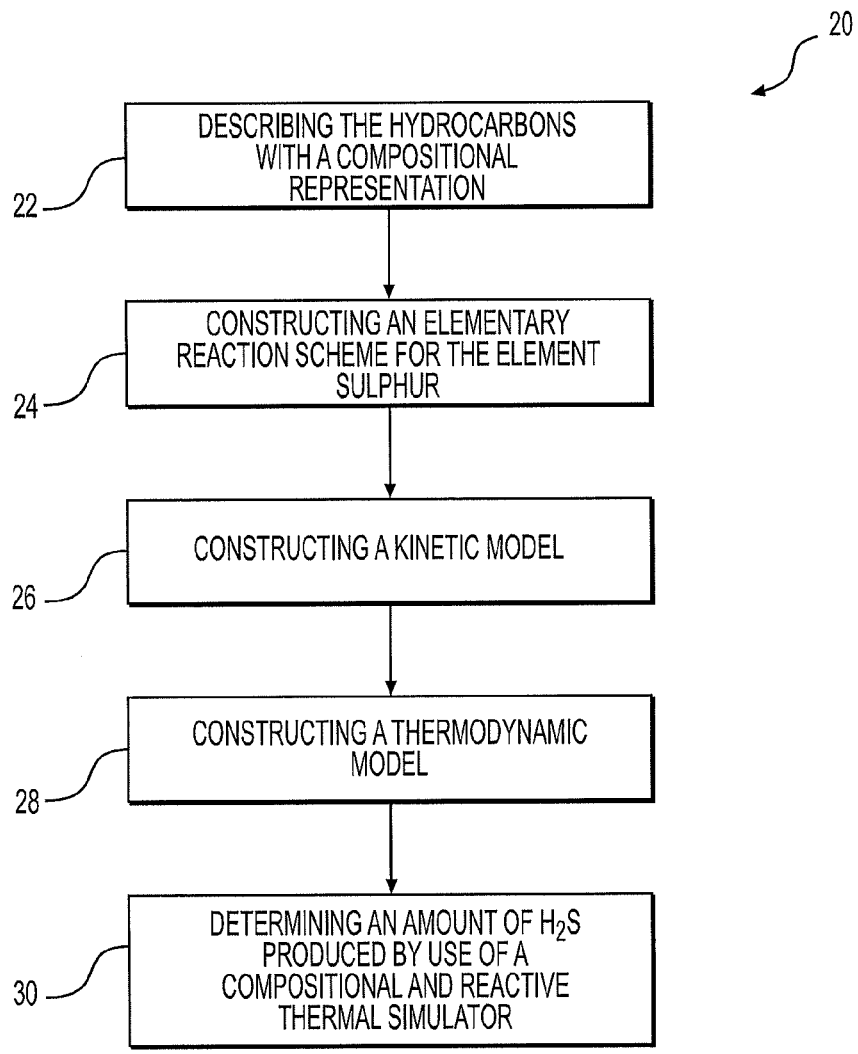
FIG. 8 is a flow chart of the steps for determining an amount of hydrogen sulfide (H$_2$S) produced by aquathermolysis induced by a thermal processing including steps a)-e) in which a) describes hydrocarbons with a compositional representation using at least H$_2$S and fractions of saturated compounds, aromatics, resins and asphaltenes, b) constructing an elementary reaction scheme representation of a material balance for the element sulfur based on the compositional representation of the hydrocarbons, and pseudo stiochiometric coefficients related to the pseudo stiochiometric constituents and other constituents, c) constructing a kinetic model based on a system of reactions simulating generation of the H$_2$S and the elementary reaction scheme, d) constructing a thermodynamic model based on the compositional representation, and e) determining an amount of the H$_2$S which is produced, by performing a compositional reservoir simulation by using a compositional and reactive thermal simulator employing the kinetic model and the thermodynamic model.

The method according to the invention comprises the following steps:

i. the amount of hydrogen sulfide ($H_2S$) produced is determined which is step 12 in FIG. 7 with the steps:
   hydrocarbons are described by use of a compositional representation using $H_2S$ and four fractions, saturated compounds, aromatics, resins and asphaltenes which is step 22 of FIG. 8;
   a thermokinetic model is constructed which is steps 24, 26 and 28 in FIG. 8 based on the compositional representation;
   the amount of hydrogen sulfide ($H_2S$) that is produced is determined by performing a compositional reservoir simulation by use of the model which is step 30 in FIG. 8;

ii. the exploitation conditions of the deposit are determined as a function of the amount of hydrogen sulphide which is step 14 in FIG. 7 and;

iii. the hydrocarbons are produced by applying the exploitation conditions which is step 16 of FIG. 7.

1. Determination of an Amount of Hydrogen Sulfide ($H_2S$) Produced

This step allows estimation, by compositional reservoir simulation, of the amount of hydrogen sulfide ($H_2S$) that would be produced if a thermal process is used for exploiting an underground reservoir impregnated with oil or bitumen containing organosulfur compounds. This step is illustrated in the flow chart 10 of FIG. 7 as step 12.

By anticipating the production of $H_2S$ even before its production, it is possible to optimize the method of exploiting the reservoir.

To estimate this production of $H_2S$, a compositional reservoir simulation is carried out using two software tools. The first is a thermokinetic model of production of hydrogen sulfide ($H_2S$) produced during exploitation, and the second tool is a reservoir simulator of the thermal, compositional and reactive simulator type.

The first step therefore constructs the thermokinetic model.

1.1 Construction of a Thermokinetic Model

This step is illustrated by steps 22, 24, 26 and 28 of FIG. 8. The crude oil is assumed to essentially be Cn+; with fractions making up the Cn− being possibly present, but it is not necessary to take them into account in the modeling. For a bitumen, the number of carbons n is typically equal to 14.

A characterization by classes of chemical compounds commonly employed in the industry is the S.A.R.A. characterization, described for example in the following document:

F. Leyssale, 1991, *"Investigation of the Pyrolysis of Alkylpolyaromatics Applied to Processes for Converting Heavy Petroleum Products. Influence of the Aromatic Nucleus on Thermal Behavior"* (in French), Thesis of the University of Paris VI, IFO Ref. No. 39 363.

It describes the crude oil in four fractions which are saturated compounds, aromatics, resins and asphaltenes, by supplying the mass fraction of each of these fractions from the crude oil. It is assumed that information of the S.A.R.A. type is available for the case of application of the method, which is step 22 of FIG. 8. It is further assumed that the content by weight of atomic sulfur in each fraction is known (measured or estimated) by elemental analysis, a technique that is well known in the art.

The method according to the invention supplies a thermokinetic model which is steps 24, 26 and 28 of FIG. 8 making it possible, using reservoir simulation software (step 1.2), to predict as a function of time, the production of $H_2S$ by reactions of aquathermolysis in an underground reservoir of heavy hydrocarbons submitted to a thermal process of steam injection which is step 12 of FIG. 7, or to a process capable of vaporizing the water naturally present in the reservoir. The reservoir simulation used is based on a compositional representation of the hydrocarbons present in the reservoir which uses $H_2S$, and if necessary one or more constituents or pseudo-constituents to represent the Cn− fraction, and, to represent the Cn+ fraction:

a pseudo-constituent representing the class of compounds not containing sulfur; this pseudo-constituent is equated to the class of saturated compounds, and is denoted by SAT, at least one pseudo-constituent representing the class of the aromatics which is denoted by ARO, one or more pseudo-constituent(s) representing the class of the resins which are denoted by $RES_1$, $RES_2$, ..., $RES_p$, one or more pseudo-constituent(s) representing the asphaltene class which are denoted by $ASP_1$, $ASP_2$, ..., $ASP_q$.

In addition to these constituents or pseudo-constituents, Nc in number, which make it possible to simulate the fluid phases, or that are to be made fluid, notably by the effect of temperature, the following are represented:

one or more pseudo-constituents of the solid type such as coke denoted by $COK_1$, $COK_2$, ..., $COK_s$ with these solid pseudo-constituents being Ns in number;

at least one constituent representing water, pure water ($H_2O$) being useful notably for modeling steam. Liquid water itself can be salty, as the formation waters generally are, and is represented otherwise than with $H_2O$ alone.

Each of the sulfur-containing pseudo-constituents {ARO, $COK_1$, $COK_2$, ..., $COK_s$, $RES_1$, $RES_2$, ..., $RES_p$, $ASP_1$, $ASP_2$, ..., $ASP_q$} is likened to a macromolecule of general formula $R_{n_R}S_{n_S}$, where S denotes the sulfur atom of mass $M_S$ and R denotes a set of atoms regarded as a single atomic pseudo-element of mass $M_R$, with $n_S$, $n_R$ denoting the numbers of atoms S and of pseudo-elements R respectively in the macromolecule of molecular weight MW. If $n_R$ is put equal to 1, the general formula of each macromolecule is $RS_{ns}$. The relation between MW, $n_S$, $M_R$ is then written:

$$MW = n_S M_S + M_R \quad (1)$$

The atomic mass of sulfur $M_S$ can be taken to be equal to 32.065 which is the value of the standard atomic mass according to the organization N.I.S.T. (National Institute of Standards and Technology, http://www.nist.gov/pml/data/comp.cfm). $M_R$ is introduced here simply to facilitate the presentation.

The content by weight of atomic sulfur $w_S$ within the macromolecule, which is assumed to be known, and which is a defined positive real quantity, is written:

$$w_S = \frac{n_S M_S}{MW} \quad (2)$$

The molecular weight MW is assumed to be known (measured or estimated by a method known per se). The number of sulfur atoms in the macromolecule is deduced simply from:

$$n_S = \frac{w_S MW}{M_S} \quad (3)$$

A Priori Reactive Model According to the Invention

The reactants considered in the reactions used for generating $H_2S$ belong to the classes of resins and asphaltenes, therefore to all of the pseudo-constituents $\{RES_1, RES_2, \ldots, RES_p, ASP_1, ASP_2, \ldots, ASP_q\}$. The reaction products typically belong to the set $\{H_2S, SAT, ARO, COK_1, COK_2, \ldots, COK_s\}$. The reaction system is a set with $N_r = p+q$ reactions, which is written:

$$\begin{vmatrix} RES_j \xrightarrow{K_{RES_j}(T)} a_{j1}H_2S + a_{j2}SAT + a_{j3}ARO + a_{j4}COK_1 + \ldots, \\ j = 1, \ldots, p \\ ASP_j \xrightarrow{K_{ASP_j}(T)} b_{j1}H_2S + b_{j2}SAT + b_{j3}ARO + b_{j4}COK_1 + \ldots, \\ j = 1, \ldots, q \end{vmatrix}, \quad (4)$$

$$\forall t \geq 0$$

with:

T: temperature t: time $a_{j1}, a_{j2}, a_{jn}$: stoichiometric coefficients, defined in such a way that the reactions are balanced in mass $b_{j1}, b_{j2}, b_{jn}$: stoichiometric coefficients, defined in such a way that the reactions are balanced in mass $K_{RES_j}(T), K_{ASP_j}(T)$: time constants per reaction j: $1 \leq j \leq p$ or $1 \leq j \leq q$ These stoichiometric coefficients can be put in the form of a matrix $[\alpha_{rk}]$ in which the number of rows is equal to the number of reactions Nr and in which the number of columns is equal to Nt=Ns+Nc. A unified representation is adopted for the Nt constituents and pseudo-constituents, reactants and products. Accordingly the stoichiometric coefficients of the reactants are negative, those of the products are positive, and zero stoichiometric coefficients are attributed to the constituents and/or pseudo-constituents appearing neither as a reactant nor as product for a given reaction. Per reaction, there is only a single reactant belonging to the set of pseudo-constituents $\{RES_1, RES_2, \ldots, RES_p, ASP_1, ASP_2, \ldots, ASP_q\}$. The stoichiometric matrix is written on a molar basis. With these conventions, the matrix of the stoichiometric coefficients, normalized per reaction (per row) with the number of moles of reactant, is written with a single value −1 per row or per reaction. This value −1 is located in the column corresponding to the single reacting constituent:

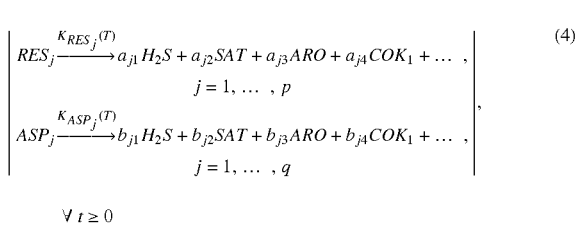

For every value of the row index r there is therefore a corresponding single value k, designated k(r), for which:

$$\alpha_{rk(r)} = -1 \quad (5)$$

This value of k is denoted k(r).

The stoichiometric coefficients $\alpha_{rk}$ must satisfy Nr equations of conservation of mass which are written:

$$\sum_{k=1}^{Nt} \alpha_{rk} MW_k = 0., \ 1 \leq r \leq Nr,$$

the $\alpha_{rk}$ being expressed in mole fractions (6)

with:

r is a row index or reaction number k is a column index that refers to a given constituent, pseudo or not, in the list of constituents and pseudo-constituents.

$MW_k$ is the molecular weight of constituent k.

According to the invention, a first estimate of the stoichiometric coefficients $\alpha_{rk}$ is obtained:

by using a zero value for the column corresponding to the pseudo-constituent SAT; this constituent is classified here as number 2: $\alpha_{r2}=0$.

from the equation: $\alpha_{rk} = e_{rk} t_{rk}$ (7), for the other columns, with:

$e_{rk}$ being the stoichiometric coefficients of an elementary kinetic model giving the distribution of sulfur in the various constituents and pseudo-constituents, presented below in the next paragraph, $t_{rk}$ is the elements of a transformation matrix, defined by the equation:

$$t_{rk} = \frac{n_{Sk(r)}}{n_{Sk}}, \quad (8)$$

where $n_{Sk}$ and $n_{Sk(r)}$ denote respectively the number of sulfur atoms in the constituent k and in the constituent k(r) with these numbers of atoms being obtained from equation (3).

On rearranging equation (6), the stoichiometric coefficients of the constituent SAT are obtained as follows:

$$\alpha_{rSAT} = -\frac{1}{MW_{SAT}} \sum_{k \neq SAT} \alpha_{rk} MW_k \qquad (9)$$

The stoichiometric coefficients $e_{rk}$ are typically taken from the elementary kinetic model defined by Lamoureux-Var and Lorant (2007) and described in patent application FR2892817, which is constructed on the distribution of all the sulfur in the different fractions of the Cn+ cut (n typically equal to 14) with the following considerations:

- it is considered that the saturated compounds fraction does not contain sulfur;
- it is considered that the sulfur contained in the resins fraction gives rise to hydrogen sulfide and is incorporated partly in the insolubles and aromatics fractions;
- it is considered that the sulfur contained in the asphaltenes fraction gives rise to hydrogen sulfide and is incorporated partly in the insolubles and aromatics fractions;
- it is further assumed that the sulfur in the asphaltenes and the sulfur in the resins do not interact; and
- moreover, it is considered that reactions coexist in parallel within each fraction and these reactions are characterized by different time constants.

The reaction system considered in this elementary kinetic model constructed on the distribution of sulfur which is step 24 is written as:

$$\begin{vmatrix} S^{RESj} \xrightarrow{K_S RESj(T)} u_{j1}S^{H2S} + 0SAT + u_{j3}S^{ARO} + u_{j4}S^{COK_1} + \ldots , \\ j = 1, \ldots, p \\ S^{ASPj} \xrightarrow{K_S ASPj(T)} v_{j1}S^{H2S} + 0S^{SAT} + v_{j3}S^{ARO} + v_{j4}S^{COK_1} + \ldots , \\ j = 1, \ldots, q \end{vmatrix} \qquad (10)$$

$$\forall t \geq 0$$

where $S^{H2S}$, $S^{RESj}$, $S^{ASPj}$, $S^{ARO}$, $S^{COK_1}$, $S_{ASPj}$, ..., denote respectively the sulfur contained in $H_2S$, the resin fraction $RES_j$, the asphaltene fraction $ASP_j$, the aromatic fraction ARO, the fraction $COK_1$, ..., the different species of sulfur considered therefore being differentiated by the molecular nature of their containment.

with:
T being temperature
t being time
$u_{j1}$, $u_{j2}$, $u_{jn}$ are stoichiometric coefficients, defined in such a way that the reactions are balanced in mass
$v_{j1}$, $v_{j2}$, $v_{jn}$÷are stoichiometric coefficients, defined in such a way that the reactions are balanced in mass
$K_sRES_j(T)$, $K_sASP_j(T)$÷are time constants per reaction j: $1 \leq j \leq p$ or $1 \leq j \leq q$.

The reaction kinetic constants are typically calculated from:

$$K_r(T) = A_r \text{Exp}\left(\frac{-E_r}{RT}\right) \qquad (11)$$

with:
R being the ideal gas constant (R=8.314 J·K$^{-1}$·mol$^{-1}$)
$A_R$ being a pre-exponential factor, also denoted by the expression "frequency factor", of reaction r; and
$E_r$ being activation energy of reaction r.

The stoichiometric coefficients $e_{rk}$ introduced above in matrix notation are easily determined by identification with the reaction system (10) by assigning a stoichiometric coefficient of −1 to the only reacting sulfur species (column index k equal to k(r)) of each reaction r.

The reactive model according to the invention, which is written based on molecular species, is modelled based on the elementary kinetic model which is step 24 of FIG. 8 defined by Lamoureux-Var and Lorant (2007), which naturally inherits kinetic parameters from the elementary kinetic model:

$$K_{RESj}(T) = K_S^{RESj}(T) \; 1 \leq j \leq p$$

$$K_{ASPj}(T) = K_S^{ASPj}(T) \; 1 \leq j \leq q \qquad (12)$$

In the method according to the invention, it is noted that:
- the molecular weight of the various pseudo-constituents being considered {SAT, ARO, $RES_1$, $RES_2$, ..., $RES_p$, $ASP_1$, $ASP_2$, ..., $ASP_q$} for representing the Cn+ fraction and {$COK_1$, $COK_2$, ..., $COK_s$} is an intrinsic data element, and as assumed by definition, with the molecular weight of a constituent being a constant parameter, which does not vary over time;
- in the set {SAT, ARO, $RES_1$, $RES_2$, ..., $RES_p$, $ASP_1$, $ASP_2$, ..., $ASP_q$, $COK_1$, $COK_2$, ..., $COK_s$} only the pseudo-constituent SAT representing the saturated compounds do not contain sulfur. It follows that all the other constituents including the $COK_k$ contain sulfur.

A Priori Thermodynamic Model According to the Invention

In reservoir simulation, it is necessary to have a thermodynamic model for estimating the properties or the behavior of the liquid and/or vapour phases of mixtures of multiple components, such as are encountered in situ in reservoirs of oil, bitumen or gas, or at the surface during exploitation of these same deposits, and offering the possibility of predicting, as a function of time, the detailed composition of fluids produced in the course of production. The construction of the thermodynamic model is step 28 of FIG. 8.

In the reactive context of the invention, it is necessary to have a compositional thermodynamic model where the compositions of the non-aqueous and non-solid phases are detailed using the same compositional base as the reactive model, namely for the Cn+ cut, on the basis of the constituents of the set {SAT, ARO, $RES_1$, $RES_2$, ..., $RES_p$, $ASP_1$, $ASP_2$, ..., $ASP_q$}.

The solids {$COK_1$, $COK_2$, ..., $COK_s$} are only characterized by their molecular weight alone, the very same that was used in equations (2) and (3), and are not considered in the calculation of the properties of the oil, gas and water phases.

The molecular weight of each of the constituents {SAT, ARO, $RES_1$, $RES_2$, ..., $RES_p$, $ASP_1$, $ASP_2$, ..., $ASP_q$} is identical to what was used for constructing the reaction model.

The other thermodynamic parameters of each of the constituents {SAT, ARO, $RES_1$, $RES_2$, ..., $RES_p$, $ASP_1$, $ASP_2$, ..., $ASP_q$} are correlated, by a known method per se, with their molecular weight.

If the choice is made to use thermodynamics by correlation, the parameters of constituents in the correlations can be adjusted based on calculations carried out with an equation of state where the parameters per constituent are typically obtained from databases when "pure substances" are involved, such as $H_2S$ (or for example such as normal pentane if the choice is made to introduce this constituent in the description of Cn–), or, when pseudo-constituents are involved, based on the correlations based at least partly on the molecular weight.

Estimation of Molecular Weights

The a priori estimation of the molecular weights of the pseudo-constituents can be based on:

measurements of molecular weights of SARA fractions carried out before or after a certain length of time/certain lengths of time in conditions of aquathermolysis;

and/or elemental analyses of the various SARA fractions carried out before or after a certain length of time/certain lengths of time in conditions of aquathermolysis;

and/or a database of molecular weights of SARA fractions constituted from elements found in the literature, or from private elements.

The a priori estimates of the molecular weights can be refined by a process of optimization under constraint:

for example to reproduce measurements of molecular weights on the crude or the bitumen taken together, measurements carried out before or after a certain length of time or certain lengths of time in conditions of aquathermolysis;

for example taking them as parameters of adjustment of simulations, at the scale of the aquathermolysis reactor, which is intended to reproduce the experimentally measured evolution of the mass fractions of the $H_2S$, saturated compounds, aromatics, resins and asphaltenes;

for example taking them as parameters of adjustment of simulations, at the scale of the reservoir, intended to reproduce the production of $H_2S$ as measured on a field exploited by a thermal process.

To preserve consistency between the reaction model and the thermodynamic model, the thermodynamic parameters of the pseudo-constituents should evolve consistently with the evolution of their molecular weight.

Thus, at the end of this step, a thermodynamic representation is constructed which is step 28 of FIG. 8 with a number Nc of components and/or pseudo-components usable for estimating the properties or the behavior of the liquid and/or vapour phases of mixtures of multiple components, such as are encountered in situ in the reservoirs of oil or gas or at the surface during exploitation of these same deposits;

the reaction scheme is constructed associated with the Nc components which is step 26 of FIG. 8, with Nr reactions, in particular the matrix Nr×Nc of the stoichiometric coefficients of the various reactions. This reaction scheme is constructed based on the elementary reaction scheme obtained by mass balance for the element sulfur distributed within fractions such as resins or asphaltene fractions which is step 24 of FIG. 8.

1.2 Carrying Out the Reservoir Simulation

In oil and/or gas field engineering, a reservoir simulator (also called formation simulator) is a software tool for simulating the processes for exploitation of underground reservoirs of hydrocarbons. Modeling of the flows in an oil reservoir or in underground storage is based essentially on application to the reservoir previously interconnected (or to a portion of the latter) of Darcy's well known law describing the flow of fluids in porous media, of laws of mass balance in each volume unit, of thermodynamic relations governing the evolution of the phase properties of the fluids such as viscosity, density, based on the initial conditions, on boundary conditions of closure of the structure, and on conditions at the producing wells and/or injectors. In the context of the invention, the software tool must permit simulation of steam injection in a heavy oil deposit taking into account the thermal effects in a chemically reactive context with the hydrocarbons (in the broad sense) being represented as multi-constituent mixtures. The formation simulator is then called thermal, compositional and reactive. An example of such a tool is the PumaFlow software (2012).

In compositional reservoir simulation, which is part of step 30 of FIG. 8 is with presence of steam, the phase equilibria between the "aqueous liquid" (called "water"), "hydrocarbon liquid" (called oil), and gas phases are calculated typically using the following hypotheses:

the gas phase contains steam, and at least the lightest of the constituents of the "hydrocarbon" type, which here is $H_2S$;

the oil phase contains all the constituents called "hydrocarbons", but does not contain water;

the "water" phase is essentially salty water, and an option of dissolution in the aqueous phase of constituents of the "hydrocarbon" type can be activated for example for $H_2S$, which, like carbon dioxide ($CO_2$), can dissolve considerably in an aqueous phase.

Calculations of Equilibrium Between Phases

The equilibria between phases are calculated on the basis of equilibrium constants per constituent calculated during simulation (or pre-calculated before the simulation) from fugacities per constituent per phase, which themselves are obtained from an equation of state, which is typically a cubic equation of state:

for the sharing of the constituents between oil and gas phases with one of the most commonly used equations being the so-called Peng-Robinson equation, described in the following two documents:

Peng, D. Y., and Robinson, D. B. 1976. *A New Two-Constant Equation of State. Industrial and Engineering Chemistry Fundamentals*, 15, 59-64.

Peng, D. Y., and Robinson, D. B. 1978. *The Characterization of the Heptanes and Heavier Fractions for the GPA Peng-Robinson Programs. Gas Processors Association, Research Report* 28, Tulsa, 1978.

For the sharing of the constituents between gas and water phases, the most commonly used equation is that of Søreide and Whitson described in the following document:

Søreide, I. and Whitson, C. H. 1992. *Peng-Robinson Predictions for Hydrocarbons $CO_2$, $N_2$, and $H_2S$ with Pure Water and NaCl Brine. Fluid Phase Equilibria*, 77, 217-240.

Commercial reservoir simulation software packages also offer the possibility of calculating the equilibria between phases from tabulated equilibrium constants, as a function of pressure and temperature and possibly as a function of a compositional index, provided as input data of the simulation.

Another possibility offered for the gas/oil equilibria is that the equilibrium constants are calculated from analytical correlations which requires inputting the parameters of each constituent in the correlations. These two possibilities, tabulated equilibrium constants or from analytical correlation, are those that are offered primarily by commercial software in the reaction and thermal context, and a description of these options can be found in the following publication:

Coats, K. H. 1980. *In-Situ Combustion Model. SPE Journal*, December, 533-554

Provided the inputs for calculating the equilibria are tabulated equilibrium constants per constituent or by correlation, a methodology employed by a person skilled in the art is to generate the tables or the parameters of the constituents from a reference equation of state. The tables must be generated for pressures and temperatures that may be encountered in the course of numerical reservoir simulation.

The parameters of the constituents in the reference equation of state are typically the critical parameters (temperature, pressure, volume or compressibility factor), the acentric factor, parameters of binary interactions between constituents.

The thermodynamic parameters of pure substances such as $H_2S$ are known and are listed by various organizations such as N.I.S.T. (National Institute of Standards and Technology, http://www.nist.gov). In contrast, the parameters of pseudo-constituents, critical parameters, acentric factor, and parameters of binary interactions must be estimated. Numerous correlations are available, including correlations based on the molecular weight of the pseudo-constituent, its density and its boiling point, and these last two properties can themselves be estimated by correlations based on the molecular weight of the pseudo-constituent. As a guide for selecting the correlations to use, it is possible to make use of certain information relating to the nature of the pseudo-constituent (such as an elemental analysis that gives the mass distribution of different atomic elements), and/or to its structure, taking inspiration for example from Boduszynski's work:

Boduszynski, M. M. 1987. *Composition of Heavy Petroleums. 1. Molecular Weight, Hydrogen Deficiency, and Heteroatom Concentration as a Function of Atmospheric Equivalent Boiling Point up to* 1400° F. (760° C.). *Energy & Fuels*, 1, 2-11

Finally, it should be noted that the measured value of the molecular weight of heavy compounds is known to depend on the experimental technique used, for example as reported by:

Merdrignac, I. and Espinat D. 2007. *Physicochemical Characterization of Petroleum Fractions: the State of the Art. Oil & Gas Science and Technology—Rev. IFP*, 62, 1, 7-32

Whatever the level of sophistication of the method used for determining them, the molecular weights of the heavy pseudo-constituents therefore are still estimates, which can be used as first estimates in a process of optimization of parameters, or are not to be modified if they are considered to be sufficiently representative, or if it is found a posteriori that the values adopted a priori were a judicious choice.

Calculations of Phase Properties

The phase properties useful for the calculations carried out in numerical compositional reservoir simulation which is part of step 30 are, per phase: viscosity, enthalpy, molecular weight, molar density (inverse of molar volume), the product of these last two properties being equal to the density, estimation of which is indispensable for the calculations of the gravity effects, the latter in fact being linked to the density differences between phases. The molecular weights of the phases can be calculated directly from the results of the equilibrium calculations that supply the compositions of each phase.

Various possibilities are offered for calculating the molar volumes of the oil and gas phases:
   from an equation of state, typically cubic, generally identical to that used for the equilibrium calculations, using the same parameters per constituent as those that are used for calculating the equilibria;
   from correlations differentiated according to the nature of the oil or gas phase, these correlations use specific parameters defined per constituent.

For calculating the viscosities, it is possible to use a single correlation for the calculations of viscosity of the oil and gas phases or, more often for the simulation of heavy oil reservoirs, one correlation for the viscosity of the oil and a different correlation for the viscosity of the gas. These correlations use specific parameters defined per constituent.

The enthalpies of the phases are usually calculated from specific heats defined per constituent and per phase, and the specific heat per constituent in the gas phase can alternatively be calculated from a specific heat per constituent in the oil phase and from a latent heat per constituent.

Further details can be found in the work of Coats cited above, in that of Crookston, and in the reference manuals of commercial reservoir simulation software such as PumaFlow.

Crookston, R. B., Culham, W. E., Chen, W. H. 1979. *A Numerical Simulation Model Recovery Processes for Thermal Recovery Processes*. SPE 6724, SPE J., February, 37-58.

The method according to the invention therefore makes it possible to model hydrocarbon fluids in a mixture of constituents with each of these constituents being characterized by thermodynamic parameters for modeling the physical properties of the fluid. This thermodynamic modeling moreover is consistent with a multi-reaction kinetic model, where one of the products of the reactions modeled is hydrogen sulfide ($H_2S$).

At the end of this step, a so-called "reservoir" simulation gives the amounts of $H_2S$ that can be generated during the exploitation of oil deposits by steam injection.

2. Determination of the Exploitation Conditions as a Function of the Amount of Hydrogen Sulfide These amounts of hydrogen sulfide can be compared to an amount measured in the past (production history). It is then possible to adjust the parameters of the kinetic model and/or of the thermal model which is part of step 30, in such a way that the estimates are more accurate for the deposit under investigation. With these adjusted models it is possible to predict the production of $H_2S$ from the deposit, for given exploitation conditions.

It is also possible to determine the exploitation conditions on adapting the completion materials and/or the gas treatment devices, so as to limit the damage caused by acid attack.

It is also possible to modify the conditions of steam injection in an attempt to reduce the amounts of $H_2S$ produced.

It is also possible to compare the amount of hydrogen sulfide against a maximum legal content (from 10 to 50 ppm by volume, according to the following organization: Agency for Toxic Substances & Disease Registry of the United States), and then determine the exploitation conditions so as to keep the production of hydrogen sulfide below this maximum legal content.

3. Production of Hydrocarbons

By applying the exploitation conditions determined in step 2, for example the amount, flow rate, and temperature of the steam injected, or the type of material, the hydrocarbons are produced observing the legal requirements and minimizing the impact on the equipment. This step is illustrated in FIG. 7 as step 16.

FIG. 8 illustrates the process substeps a)-e) used to determine the amount of $H_2S$ produced by aquathermolysis which is step 12 of FIG. 7.

Nonlimiting Embodiment Example

The example described below was carried out using the PumaFlow simulator as a commercial tool for reservoir simulation, but other commercial reservoir simulation software could have been used instead of this simulator. The three fluid phases represented are an aqueous phase, a so-called oil phase, and a gas phase. This software is used here for modeling steam injection in a heavy oil reservoir taking into account thermal and compositional effects in a chemically reactive context. Options employed conventionally in compositional and thermal reservoir simulation are selected for calculating the phase equilibria and the phase properties:

- using tables of equilibrium constants per constituent for calculating the gas/oil equilibria with all the organic pseudo-constituents and the $H_2S$ being assumed to be shared between the oil phase and the gas phase;
- using tables of gas-water equilibrium constants for the $H_2S$ with the only constituent assumed to dissolve in the aqueous phase;
- the using correlations for calculating the properties of the oil and gas phases (density, viscosity, enthalpy) with the parameters per constituent used in these correlations partly being tabulated as a function of temperature (and of pressure, for the parameters involved in calculating the densities).

Thermokinetic Modeling

Aquathermolysis experiments were conducted on samples of bitumen originating from Fisher Field Athabasca, some of the results having been published in Lamoureux-Var et al. (2010).

The results of these aquathermolysis experiments were interpreted in terms of distribution of sulfur in the various fractions, and are reflected in the following stoichiometric matrix:

The aquathermolysis experiments are carried out by putting known amounts of crude oil, of rock, and of water in a gold tube placed after evacuation of the air under nitrogen confinement. The tube, once sealed, is put in a chamber maintained at constant pressure, and in turn the chamber is put in a furnace maintained at constant temperature, for a given length of time. The experiments are conducted at different temperatures and for different durations. On leaving the furnace, the gold tubes are cooled, pierced in a controlled environment, then the contents of the gold tubes are analyzed and quantified by mass, separating: the gases, which are recovered by evacuation at 10-5 bar, and analyzed by gas chromatography, C14+ which undergoes a SARA analysis and the insoluble fraction, elemental analyses being carried out on the SARA fractions, and on the insoluble fraction.

The thermokinetic modeling for the reservoir simulations is based on the following hypotheses and simplifications:

- the oil being considered is, in its initial state, a C14+ cut;
- a description of the SARA type is adopted with 4 pseudo-constituents (called SAT, ARO, RES, ASP) with the pseudo-constituents RES and ASP each being split into two pseudo-constituents, respectively RES1, RES2 and ASP1, ASP2, which makes it possible to represent the reactions, as introduced by an elementary kinetic model based on the sulfur distribution;
- a single solid reaction product constituent is considered, referred to as "COK", to represent the solid residue receiving the sulfur coming from the organosulfur pseudo-constituents.

The results of the elemental analyses are taken into account, by a known method per se, for fixing the a priori values of the molecular weights of the pseudo-constituents.

First, a Peng-Robinson equation of state (EOS) is used for modeling the density of the oil and gas phases. A first

TABLE 1

STOICHIOMETRIC MATRIX $[e_{rk}]$ RESULTING FROM THE AQUATHERMOLYSIS EXPERIMENTS

| Reaction | Reactant | $S(H_2S)$ | S(SAT) | S(ARO) | S(RES1) | S(RES2) | S(ASP1) | S(ASP2) | S(COK) |
|---|---|---|---|---|---|---|---|---|---|
| R1 | S(RES1) | 0 | 0.60 | 0.38 | −1 | 0 | 0 | 0 | 0.40 |
| R2 | S(RES2) | 1.00 | 0 | 0.00 | 0 | −1 | 0 | 0 | 0.00 |
| R3 | S(ASP1) | 0.00 | 0 | 0.00 | 0 | 0 | −1 | 0 | 1.00 |
| R4 | S(ASP2) | 0.07 | | | 0 | 0 | 0 | −1 | 0.33 | and of the kinetic constants per reaction according to equation (11), which are calculated using, per reaction, a frequency factor and an activation energy. The frequency factors are given in the following table.

TABLE 2

FREQUENCY FACTORS, DAY-1

| Reaction | (1) |
|---|---|
| R1 | 8.64E+18 |
| R2 | 8.64E+18 |
| R3 | 8.64E+18 |
| R4 | 8.64E+18 |

Table (1) shows that interpretation of the experimental results required the introduction of two species of resins and two species of asphaltenes.

estimate of the parameters of the pseudo-constituents in the EOS is obtained using correlations based on the molecular weight:

for the critical parameters:

Souahi, F. and Kaabeche, H. 2008. *Developing Correlations for Prediction of Petroleum Fraction Properties using Genetic Algorithms, OGST*, 63, No. 2, March-April, 229-237;

for the acentric factors, a private correlation inspired by that proposed by Souahi et al. (2008);

for the parameters of binary interactions of the pseudo-constituents with $H_2S$:

Stamataki, S. and Magoulas, K. 2000. *Prediction of Phase Equilibria and Volumetric Behavior of Fluids with High Concentration of Hydrogen Sulfide. Oil & Gas Science and Technology—Rev. IFP*, 55, 5, 511-522; and for the volume corrections:

Loria, H, Pereira-Almao, P. and Satyro, M. 2009. *Prediction of Density and Viscosity of Bitumen Using the Peng-Robinson Equation of State. Ind. Eng. Chem. Res.,* 48, 10129-10135;

These parameters were adjusted for setting a specific gravity of the crude of 10 degrees API.

For the specific heats of the pseudo-constituents, the correlation of Dadgostar and Shaw (2012) based on the number of atoms per mass unit is used. This information is obtained from the estimate of the molecular weight and from measurements of elemental analyses:

Dadgostar, N., Shaw, J. M. 2012. *A Predictive Correlation for the Constant-Pressure Specific Heat Capacity of Pure and Ill-Defined Liquid Hydrocarbons. Fluid Phase Equilibria,* 313, 211-226;

The specific gravities and the boiling points per constituent required for certain correlations were obtained by correlation with the molecular weight.

Table 3 presents the parameters of the pseudo-constituents that were obtained:

TABLE 3

EOS PARAMETERS OF THE PSEUDO-CONSTITUENTS

| Name | MW, g | Tc, °C. | Pc, bar | ω | Cv, cm$^3$ | δH$_2$S |
|------|-------|---------|---------|------|--------|---------|
| SAT  | 195.11 | 435.95 | 19.26 | 0.5875 | 17.4 | 0.01489 |
| ARO  | 930.38 | 759.47 | 8.51  | 1.4115 | −131.5 | −0.10854 |
| RES1 | 1324.40 | 808.81 | 7.71 | 1.5509 | −344.9 | −0.12942 |
| RES2 | 1318.43 | 808.26 | 7.72 | 1.5494 | −341.3 | −0.12919 |
| ASP1 | 2702.30 | 868.77 | 7.02 | 1.7106 | −1313.4 | −0.15335 |
| ASP2 | 2691.02 | 868.56 | 7.02 | 1.7101 | −1305.0 | −0.15327 |
| COK  | 15.06 | | | | | |

Calculations of thermodynamic equilibria were carried out with known software, referred to as a "PVT Package", at various pressures and temperatures, and varying the compositions of the mixtures. The density results from these calculations were taken as reference for obtaining the parameters of the constituents in the correlations for calculating the densities, and the compositions of the phases were used for generating the tables of gas/oil equilibrium constants as a function of the pressure and temperature.

The equilibrium constants for the gas-water system were generated using the Søreide-Whitson equation of state (1992).

Figure 1:
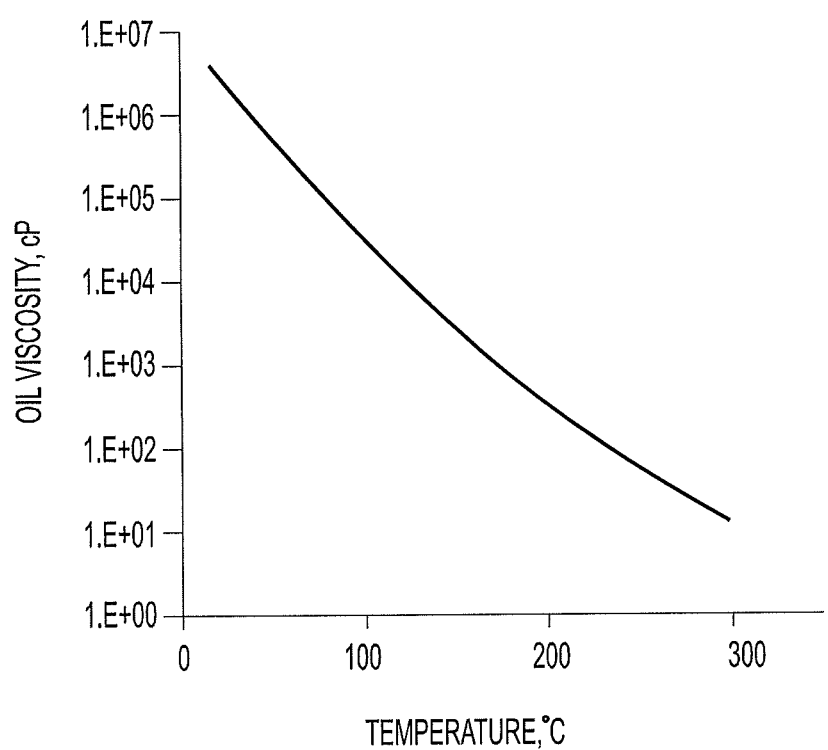
FIG. 1 is a curve of viscosity of dead oil (10$^{-2}$ poise) as a function of temperature (° C.)

As the oil phase is not modeled as a dead oil, the modeling of oil viscosity must take account of the possible presence of H$_2$S (in small amounts) in the oily phase. A table of the viscosities per constituent relative to temperature was generated somewhat empirically, but in order to obtain a viscosity behavior of the dead oil probable for the Foster Creek sector. The viscosity curve of the dead oil as simulated with these tables is illustrated in FIG. 1 as a function of temperature.

The matrix of the stoichiometric coefficients based on the pseudo-constituents, obtained directly from the stoichiometric matrix based on the sulfur distribution given in Table 1 using equations (7), (8) and (9), is given in Table 4.

TABLE 4

STOICHIOMETRIC MATRIX [α$_{r,k}$] (1) FOR THE RESERVOIR SIMULATIONS

| Reaction | Reactant | H$_2$S | SAT | ARO | RES1 | RES2 | ASP1 | ASP2 | COK |
|----------|----------|--------|-----|-----|------|------|------|------|-----|
| R1 | RES1 | 0.4950000 | 2.8579821 | 0.5979021 | −1 | 0 | 0 | 0 | 12.8571429 |
| R2 | RES2 | 2.1000000 | 6.3905081 | 0.0000000 | 0 | −1 | 0 | 0 | 0.0000000 |
| R3 | ASP1 | 0.0000000 | 7.8735564 | 0.0000000 | 0 | 0 | −1 | 0 | 77.4285714 |
| R4 | ASP2 | 0.3514000 | 1.8603513 | 2.1062937 | 0 | 0 | 0 | −1 | 23.6657143 |

In the various simulations of the experimental reactor, the results of which are presented below, certain adjustments were made to the stoichiometric coefficients. That is why this first version of the stoichiometric matrix is identified with the label (1).

Simulations of the Aquathermolysis Experiments Using Reservoir Simulation Software The aquathermolysis experiments were simulated with a reservoir simulator for validating the thermokinetic model.

In the simulation model, a single cell is used for representing the experimental "reactor" (the gold tube). This cell is surrounded by cells representing the furnace. Only heat flows are permitted between the "reactor" cell and the surrounding cells. Moreover, the "reactor" cell is not perforated by any well: it is therefore "sealed" like the experimental reactor. The "reactor" cell is initialized with the same proportions of sand, oil, water, and nitrogen (constituent added to the list of the aforementioned constituents) as in the experiments, and the initial pressure is fixed at 100 bar, the pressure used in the experiments. The reactor temperature is fixed at 320° C., which is the highest temperature used for the aquathermolysis experiments.

The results of different simulations are compared against the experimental results in FIGS. 2.1 and 2.2. These figures show, on the left, the evolution as a function of time of the mass fractions of the pseudo-constituents SAT, ARO and of the mass fractions RES and ASP corresponding respectively to the sum of the mass fractions RES1 and RES2 and to the sum of the mass fractions ASP1 and ASP2. These figures show, on the right, as a function of time, the mass of H$_2$S relative to the sum of the masses of the pseudo-constituents SAT, ARO, RES1, RES2, ASP1, ASP2. The points are the experimental results, and the lines are the simulated results.

The results presented in FIG. 2.1 (*a*) were obtained with stoichiometry (1), the activation energies and the frequency factors (Table 2) resulting directly from interpretation of the experiments. It can be seen that the simulated reaction rates are too high relative to those observed experimentally. The results presented in FIG. 2.1 (*b*) were obtained still with stoichiometry (1), keeping the same activation energies but with frequency factors reduced by about a factor of 2 (data in column 2 of Table 5), which is still a very modest adjustment.

TABLE 5

FREQUENCY FACTORS, DAY-1

| Reaction | (2) | (3) |
|----------|-----|-----|
| R1 | 4.50E+18 | 4.50E+18 |
| R2 | 4.50E+18 | 4.50E+18 |

TABLE 5-continued

| FREQUENCY FACTORS, DAY-1 | | |
|---|---|---|
| Reaction | (2) | (3) |
| R3 | 4.50E+18 | 3.50E+18 |
| R4 | 4.50E+18 | 4.50E+18 |

With this modification of the frequency factors, (cf. FIG. 2.1 (b)) good adjustment of the time-dependent decrease of the mass fractions of resins (RES1+RES2) and of asphaltene (ASP1+ASP2) is obtained, but the simulated production of saturated compounds (SAT) increases too much, at the expense of the production of aromatics (ARO), relative to the experimental results, and the production of $H_2S$ is not reproduced.

Since the stoichiometry of the pseudo-constituent SAT, not containing sulfur, is not obtained directly from the experimental results, and is obtained by applying a mass balance equation, it absorbs all the experimental uncertainties. Moreover, according to the Lamoureux-Var model (2007), the sulfur contained in the aromatics does not participate in the generation of $H_2S$ (non-labile sulfur). An adjustment of the SAT/ARO stoichiometry is therefore considered to be indicated, without altering the other coefficients. For this purpose, in a reaction r, starting from the stoichiometric coefficients $\alpha_{rSAT}$ and $\alpha_{rARO}$, a new value is fixed for the stoichiometric coefficient $\alpha'_{rSAT}$ of the pseudo-constituent SAT, and the coefficient $\alpha'_{rARO}$ is recalculated in such a way that the mass balance of the reaction is still respected, i.e. so that:

$$\alpha'_{rSAT}MW_{SAT} + \alpha'_{rARO}MW_{ARO} = \alpha_{rSAT}MW_{SAT} + \alpha_{rARO}MW_{ARO} \tag{13}$$

therefore:

$$\alpha'_{rARO} = (\alpha_{rSAT} - \alpha'_{rSAT})\frac{MW_{SAT}}{MW_{ARO}} + \alpha_{rARO} \tag{14}$$

Table (6) repeats stoichiometric matrix (1) and gives the details of the stoichiometric matrix (2) used for adjusting the production of the saturated compounds and aromatics, as illustrated in FIG. 2.2 (a). Bold characters are used for highlighting the differences between matrices (1) and (2). It can be seen in FIG. 2.2 (a) that there is good agreement between simulated results and experimental results regarding evolution of the SARA fractions, but the simulated production of $H_2S$ is still much lower than the experimental production of $H_2S$.

The stoichiometric matrix (3) given in Table (6) makes it possible to reproduce the production of $H_2S$ obtained experimentally. This is illustrated in FIG. 2.2 (b). The bold characters highlight the modified coefficients. It can be seen that the stoichiometry of COK has been reduced and the stoichiometry of $H_2S$ has been increased, in such a way that the mass balance of the reaction is still respected, so that:

$$\alpha'_{rH2S}MW_{H2S} + \alpha'_{rCOK}MW_{COK} = \alpha_{rH2S}MW_{H2S} + \alpha_{rCOK}MW_{COK} \tag{15}$$

therefore:

$$\alpha'_{rH2S} = (\alpha_{rCOK} - \alpha'_{rCOK})\frac{MW_{COK}}{MW_{H2S}} + \alpha_{rH2S} \tag{16}$$

TABLE 6

| STOICHIOMETRIC MATRIXES [$\alpha_{r,k}$] FOR THE RESERVOIR SIMULATIONS | | | | | | | | | |
|---|---|---|---|---|---|---|---|---|---|
| Reaction | Reactant | $H_2S$ | SAT | ARO | RES1 | RES2 | ASP1 | ASP2 | COK |
| Stoichiometric matrix (1) | | | | | | | | | |
| R1 | RES1 | 0.4950000 | 2.8579821 | 0.5979021 | −1 | 0 | 0 | 0 | 12.8571429 |
| R2 | RES2 | 2.1000000 | 6.3905081 | 0.0000000 | 0 | −1 | 0 | 0 | 0.0000000 |
| R3 | ASP1 | 0.0000000 | 7.8735564 | 0.0000000 | 0 | 0 | −1 | 0 | 77.4285714 |
| R4 | ASP2 | 0.3514000 | 1.8603513 | 2.1062937 | 0 | 0 | 0 | −1 | 23.6657143 |
| Stoichiometric matrix (2) | | | | | | | | | |
| R1 | RES1 | 0.4950000 | 2.8579821 | 0.5979021 | −1 | 0 | 0 | 0 | 12.8571429 |
| R2 | RES2 | 2.1000000 | 6.3905081 | 0.0000000 | 0 | −1 | 0 | 0 | 0.0000000 |
| R3 | ASP1 | 0.0000000 | 0.7000000 | 1.5043795 | 0 | 0 | −1 | 0 | 77.4285714 |
| R4 | ASP2 | 0.3514000 | 1.8603513 | 2.1062937 | 0 | 0 | 0 | −1 | 23.6657143 |
| Stoichiometric matrix (3) | | | | | | | | | |
| R1 | RES1 | 0.4950000 | 2.8579821 | 0.5979021 | −1 | 0 | 0 | 0 | 12.8571429 |
| R2 | RES2 | 2.1000000 | 6.3905081 | 0.0000000 | 0 | −1 | 0 | 0 | 0.0000000 |
| R3 | ASP1 | 5.9341046 | 0.7000000 | 1.5043795 | 0 | 0 | −1 | 0 | 64.0000000 |
| R4 | ASP2 | 0.3514000 | 1.8603513 | 2.1062937 | 0 | 0 | 0 | −1 | 23.6657143 |

Modifying the distribution of sulfur between the solid and the $H_2S$ therefore allows calibration of the experimental results. It should be noted, moreover, that $H_2S$ is recognized to have high capacity for adsorption on solids related to coke.

It has been shown that $H_2S$ has the capacity to be adsorbed on coke with a large specific surface. It therefore follows that the $H_2S$ generated by aquathermolysis in given conditions of pressure and temperature could be adsorbed on the organic solid residue generated by the reactions (potentially similar to coke), or also on the mineral solids.

The experimental protocol used for distributing the sulfur between the various fractions after the aquathermolysis experiments comprises depressurization, followed by evacuation, and cooling of the aquathermolysis reactors. It therefore follows that, since the $H_2S$ was adsorbed on solid species in the aquathermolysis reactor, the experimental protocol can induce at least partial desorption of the adsorbed $H_2S$. This desorption would not have occurred if the gas and oil samples were taken while keeping the reactor under pressure and temperature.

It therefore follows that the amount of $H_2S$ measured experimentally represents a maximum potential production of $H_2S$, and a phenomenon of adsorption on solids can maintain a proportion of the $H_2S$ generated by aquathermolysis in the reactor maintained at pressure and temperature.

According to one of the features of the invention, such a phenomenon of adsorption can be taken into account by a relative change of the $H_2S$/COK stoichiometry in the reaction system considered for modeling the production of $H_2S$ by aquathermolysis.

Simulation of the Production of $H_2S$ During Exploitation of a Heavy Oil Reservoir Submitted to a SAGD Process The reservoir model that was used in the simulations reported here is a cutting plane of the reservoir in a grid in two directions X and Z (Z: depth). The reservoir is homogeneous; the properties are shown in Table 7. The initial composition of the reservoir crude is found directly from the experimental measurements carried out on the samples of the deposit. The other properties are general properties that are probable for an Athabasca bituminous sand exploited by a SAGD process. The curves of relative permeabilities used in the simulations are presented in FIG. 3. The reservoir is exploited by use of two horizontal wells, a producer and an injector, drilled perpendicularly to the cutting plane. As an aquifer zone is present at the bottom of the reservoir, the producer is located at about 8 m above the water-oil contact, and the injector about 5.5 m above the producer. After a preheating time, saturated steam (of 0.95 grade) is injected. After about 250 days of steam injection, the injection pressure is kept approximately constant and equal to 32.5 bar.

TABLE 7

RESERVOIR CHARACTERISTICS

| | |
|---|---|
| Depth of roof, m | 300 |
| Overall dimensions in the X, Y, Z directions, m | 100, 720, 58.5 |
| Thickness of the zone with oil and the water-bearing zone, m | 43.2, 15.3 |
| Permeability, horizontal, vertical, mD | 10000, 3500 |
| Porosity, fraction | 0.37 |
| Initial pressure @343.2 m, bar | 32.2 |
| Initial temperature, ° C. | 17.0 |
| Density of the oil, API | 10 |
| Viscosity of the oil, cP | 3.8E+06 |
| Initial water saturation, fraction volume of pores | 0.22 |
| Initial composition of the crude, mole fraction | |
| $H_2S$ | 0.00000 |
| SAT | 0.60752 |
| ARO | 0.14992 |
| RES1 | 0.04071 |
| RES2 | 0.14499 |
| ASP1 | 0.01871 |
| ASP2 | 0.03815 |

A first simulation was executed using stoichiometry (3). FIG. 4.1 presents the results of the simulation as a function of time of cumulative oil production, and the ratio of the steam/oil cumulative productions. The flow rate of oil produced in surface conditions and the bottom temperature of the injection well are shown in FIG. 4.2.

The simulated production of $H_2S$, expressed, as is customary in publications on this subject, in liters of $H_2S$ per $m^3$ of oil at the surface, is presented in FIG. 5, with the production of $H_2S$ deduced from measurements between 2005 and 2012 on the Fisher Field published by the oil companies Encana and Cenovus, on the website of the Energy Resources Conservation Board (2012). The same figure shows the simulated production of $H_2S$ obtained using stoichiometry (2) in the simulation, all other things remaining equal.

Figure 6:
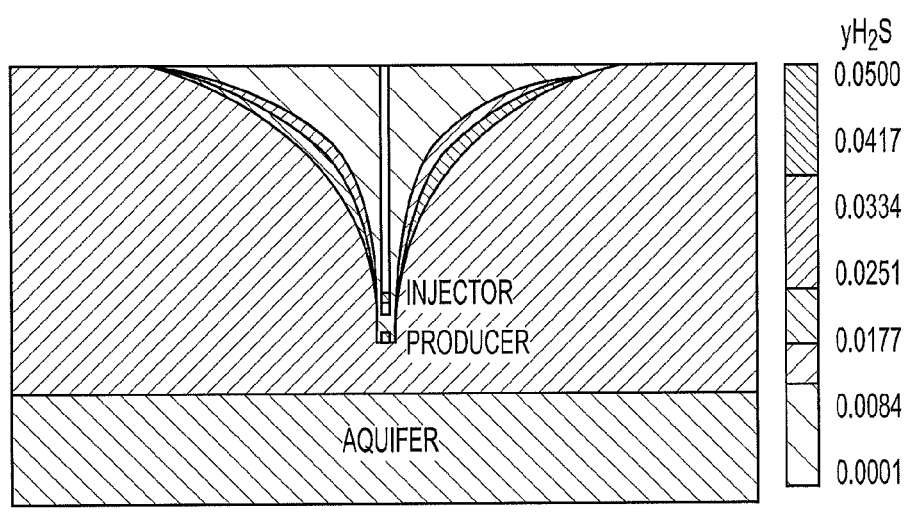
FIG. 6 illustrates the mole fraction of the gas phase after 4 years of production with the gas phase not being defined in the zones in light gray and in zones where there is no gas phase.

An X-Z map of the mole fraction of $H_2S$ in the gas phase, after about 4 years of production, is shown in FIG. 6. This map is obtained from the results of the simulation with stoichiometry (2), but the qualitative return is about the same with stoichiometry (3): the highest concentrations of $H_2S$ are observed at the limit of the steam chamber where there are simultaneously high temperatures and reagents in abundance. The behavior of the design section modeled, results at the wells and in the cells, is in overall agreement with expectations.

It can be seen in FIG. 5 that the production of $H_2S$ obtained with stoichiometry (2), —which calibrated the experimental results of evolution of the SARA fractions as a function of time—, is much more in agreement with the field data than that obtained with stoichiometry (3), —which in addition calibrated the experimental production of $H_2S$—.

Moreover, a study was conducted of the sensitivity to various parameters of the simulations: size of the cells, effect of dissolution of $H_2S$ in the aqueous phase, thermodynamics by correlation or by equation of state, variation of the conditions of pressure (initial pressure and injection pressure) in the range from 28 bar to 40 bar (for this range of pressures, the injection temperature varies in the range of 230-250° C.; in fact, as the steam injected is steam saturated with water, it will be recalled that the curve of water saturation pressure as a function of the temperature creates a relation that is biunivocal in injection pressure and injection temperature). In all cases, the results obtained, expressed in liters of $H_2S$ per $m^3$ of oil produced, are similar to those presented in FIG. 5, i.e. the results obtained with stoichiometry (2) are much more consistent with the field data than those obtained with stoichiometry (3).

In the simulations that were carried out (cf. FIG. 4.2), as well as in the reality of exploitation of the Fisher Field between 2005 and 2012, the period during which the field data was collected, the exploitation conditions aim to maintain the reservoir at temperature to conserve the reduction in oil viscosity connected with the temperature rise. As there is a close connection between temperature and pressure in the processes for injection of saturated steam, the reservoir is neither depressurized nor cooled, as is the case for the experimental reactor. If $H_2S$ generated by the reactions of aquathermolysis is adsorbed on solids in the reservoir, there is no particular source of desorption without depressurization or cooling of the reservoir. As the hypothesis of such an adsorption phenomenon is plausible, there is a source of apparent disagreement between the experimental results of aquathermolysis and the measurements in the field, and the relative stoichiometry of sulfur between the solid and the $H_2S$ can be used as a parameter for adjustment of this phenomenon, while preserving the other parameters of the thermokinetic model, parameters that are calibrated solely on the evolution of the SARA fractions.

Since the specific surface of the coke produced in situ by the reactions of aquathermolysis is not known, the values of the capacities for adsorption of $H_2S$ obtained from the literature might not be relevant for the coke generated in situ by aquathermolysis. However, while the hypothesis according to which $H_2S$ can be trapped by adsorption in the reservoir holds, the production of $H_2S$ measured in the laboratory, modeled by stoichiometry (3), can be regarded as that which would correspond to maximum desorption, whereas the production of $H_2S$ modeled by stoichiometry (2), which is of the order of magnitude of the field data, would account for the $H_2S$ trapped in the reservoir by adsorption on the coke. Taking into account the initial composition of the oil, assuming that the reactions have reached final equilibrium, and ascribing the difference between stoichiometry (2) and (3) to an effect of adsorption of $H_2S$ on the COK, a capacity for adsorption can be calculated, which is thus estimated at about 0.09 gram $H_2S$ per gram of the constituent COK for conditions of pressure and temperature at the places of reactions of about 33 bar and 240° C. This value is not inconsistent with the values of 2.9 grams of $H_2S$ per gram of coke at 100 bar and 25° C. of Li et al. (2011), and of 0.02 g/g at atmospheric pressure and a temperature in the range of 200-250° C. of Itaya et al. (2011).

It can be seen that the methodology for constructing a thermokinetic model usable in reservoir simulation based on the invention of Lamoureux-Var (2007) it possible to obtain, once the thermokinetic model was introduced in a reservoir simulation at the field scale, a production of $H_2S$ consistent with published data with much smaller adjustments of parameters than those employed in the methods of the prior art.

The invention claimed is:

1. A method of producing hydrocarbons from an underground deposit of hydrocarbons containing organosulfur compounds, comprising:
   i. determining an amount of hydrogen sulfide ($H_2S$) produced by aquathermolysis induced by a thermal processing including steps of:
      a) using a computer to describe the hydrocarbons with a compositional representation using at least the $H_2S$ and fractions of saturated compounds, aromatics, resins and asphaltenes;
      b) using a computer to construct an elementary reaction scheme representative of a material balance for elemental sulphur based on the compositional representation of the hydrocarbons, and pseudo-stoichiometric coefficients related to pseudo-stoichiometric constituents and other constituents;
      c) using a computer to construct a kinetic model based on a system of reactions simulating generation of the $H_2S$ and the elementary reaction scheme;
      d) using a computer to construct a thermodynamic model based on the compositional representation; and
      e) using a computer to determine an amount of the $H_2S$ to be produced, by performing a compositional reservoir simulation by using a compositional and a reactive thermal simulation employing the kinetic model and the thermodynamic model;
   ii. determining exploitation conditions of the underground deposit as a function of an amount of $H_2S$ therein; and
   iii. producing the hydrocarbons as a function of the amount of $H_2S$ to be produced by applying the exploitation conditions so than an amount of $H_2S$ actually produced with the hydrocarbons from the underground deposit is below a maximum legal limit.

2. A method according to claim 1, wherein the kinetic model is constructed based on an assumption that reactants of $H_2S$ generated reactions belong to classes of resins and asphaltenes, and based on an assumption that products of the generated reactions belong to a set of $H_2S$ saturated compounds, aromatics and a solid type pseudo-constituent.

3. A method according to claim 1, wherein the kinetic model comprises Nt constituents and Nr reactions, and a constructed matrix Nr×Nt of stoichiometric coefficients of the reactions wherein the stoichiometric coefficients are determined from an elementary reaction scheme obtained by a mass balance for the elemental sulfur.

4. A method according to claim 2, wherein the kinetic model comprises Nt constituents and Nr reactions, and a constructed matrix Nr×Nt of stoichiometric coefficients of the reactions wherein the stoichiometric coefficients are determined from an elementary reaction scheme obtained by a mass balance for the elemental sulfur.

5. A method according to claim 1, comprising:
   adjusting the kinetic model by simulating aquathermolysis experiments or by simulating behavior of the underground deposit subjected to a thermal process from which measurements of production allow calculation of $H_2S$ production.

6. A method according to claim 2, comprising:
   adjusting the kinetic model by simulating aquathermolysis experiments or by simulating behavior of the underground deposit subjected to a thermal process from which measurements of production allow calculation of $H_2S$ production.

7. A method according to claim 3, comprising:
   adjusting the kinetic model by simulating aquathermolysis experiments or by simulating behavior of the underground deposit subjected to a thermal process from which measurements of production allow calculation of $H_2S$ production.

8. A method according to claim 4, comprising:
   adjusting the kinetic model by simulating aquathermolysis experiments or by simulating behavior of the underground deposit subjected to a thermal process from which measurements of production allow calculation of $H_2S$ production.

9. A method according to claim 1, comprising:
   adjusting time constants of a kinetic field to restore a decrease in resins and asphaltenes as a function of time, and at least one of adjusting relative stoichiometry between fractions of saturated compounds and aromatics, and relative stoichiometry between $H_2S$ and a solid type pseudo-constituent.

10. A method according to claim 2, comprising:
    adjusting time constants of a kinetic field to restore a decrease in resins and asphaltenes as a function of time, and at least one of adjusting relative stoichiometry between fractions of saturated compounds and aromatics, and relative stoichiometry between $H_2S$ and a solid type pseudo-constituent.

11. A method according to claim 3, comprising:
    adjusting time constants of a kinetic field to restore a decrease in resins and asphaltenes as a function of time, and at least one of adjusting relative stoichiometry between fractions of saturated compounds and aromatics, and relative stoichiometry between $H_2S$ and a solid type pseudo-constituent.

12. A method according to claim 4, comprising:
    adjusting time constants of the kinetic model to restore a decrease in resins and adjusting time constants of a kinetic field to restore a decrease in resins and asphaltenes as a function of time, and at least one of adjusting relative stoichiometry between fractions of saturated compounds and aromatics, and relative stoichiometry between H₂S and a solid type pseudo-constituent.

13. A method according to claim 1, wherein the compositional representation comprises:
    pseudo-constituents representing fluid phases and phases that become fluids in response to temperature change;
    at least one solid type pseudo-constituent; and
    at least one constituent representing water.

14. A method according to claim 2, wherein the compositional representation comprises:
    pseudo-constituents representing fluid phases and phases that become fluids in response to temperature change;
    at least one solid type pseudo-constituent; and
    at least one constituent representing water.

15. A method according to claim 3, wherein the compositional representation comprises:
    pseudo-constituents representing fluid phases and phases that become fluids in response to temperature change;
    at least one solid type pseudo-constituent; and
    at least one constituent representing water.

16. A method according to claim 4, wherein the compositional representation comprises:
    pseudo-constituents representing fluid phases and phases that become fluids in response to temperature change;
    at least one solid type pseudo-constituent; and
    at least one constituent representing water.

17. A method according to claim 5, wherein the compositional representation comprises:
    pseudo-constituents representing fluid phases and phases that become fluids in response to temperature change;
    at least one solid type pseudo-constituent; and
    at least one constituent representing water.

18. A method according to claim 1, wherein:
    a fraction of saturated compounds among reaction products represents only a fraction of compounds which do not contain sulfur.

19. A method according to claim 2, wherein:
    a fraction of saturated compounds among reaction products represents only a fraction of compounds which do not contain sulfur.

20. A method according to claim 3, wherein:
    a fraction of saturated compounds among reaction products represents only a fraction of compounds which do not contain sulfur.

21. A method according to claim 4, wherein:
    a fraction of saturated compounds among reaction products represents only a fraction of compounds which do not contain sulfur.

22. A method according to claim 5, wherein:
    a fraction of saturated compounds among reaction products represents only a fraction of compounds which do not contain sulfur.

23. A method according to claim 13, wherein:
    a fraction of saturated compounds among reaction products represents only a fraction of compounds which do not contain sulfur.

24. A method according to claim 14, wherein:
    a fraction of saturated compounds among reaction products represents only a fraction of compounds which do not contain sulfur.

25. A method according to claim 1, comprising:
    comparing an amount of H₂S which is present to an amount of hydrogen sulphide previously measured; and
    adjusting parameters of at least one of the kinetic model and the thermodynamic model.

26. A method according to claim 25, comprising:
    predicting production of H₂S from the underground deposit from the kinetic and the thermodynamic models which are adjusted.

27. A method according to claim 1, comprising:
    determining the exploitation conditions by adapting at least one of completion materials and gas treatment devices.

28. A method according to claim 27, comprising:
    modifying the exploitation conditions by adapting conditions of steam injection.

* * * * *